United States Patent [19]

Buckley et al.

[11] Patent Number: 4,933,714
[45] Date of Patent: Jun. 12, 1990

[54] APPARATUS AND METHOD FOR REPRODUCING A PATTERN IN AN ANNULAR AREA

[75] Inventors: Jere D. Buckley; Daniel N. Galburt, both of Wilton; Charles Karatzas; Harry Sewell, both of Ridgefield; Frits Zernike, Rowayton, all of Conn.

[73] Assignee: The Perkin-Elmer Corporation, Norwalk, Conn.

[21] Appl. No.: 368,978

[22] Filed: Jun. 20, 1989

Related U.S. Application Data

[63] Continuation of Ser. No. 200,142, May 31, 1988, abandoned.

[51] Int. Cl.$^5$ .................. G03B 27/52; G03B 27/70
[52] U.S. Cl. .................................... 355/43; 355/53; 355/66; 355/71; 355/51
[58] Field of Search ................ 355/43, 51, 66, 71, 355/53

[56] References Cited

U.S. PATENT DOCUMENTS

| 3,748,015 | 7/1973 | Offner | 350/620 |
| 3,884,573 | 5/1975 | Franklin | 355/51 |
| 3,951,546 | 4/1976 | Markle | 355/51 |
| 4,011,011 | 3/1977 | Hemstreet et al. | 355/51 |
| 4,650,315 | 3/1987 | Markle | 355/43 |

Primary Examiner—Monroe H. Hayes
Attorney, Agent, or Firm—Thomas P. Murphy; Edwin T. Grimes

[57] ABSTRACT

A master disk is positioned such that a radial portion thereof is within a restricted field having good imagery of an optical projection system. A second blank disk is positioned such that the image location extends along a radial portion thereof. As the two disks are rotated synchronously a pattern in an annular area is formed on the blank disk replicating the master. Good imagery of the pattern is obtained with a simple system having an image field less than the size of the object being reproduced.

4 Claims, 2 Drawing Sheets

U.S. Patent Jun. 12, 1990 Sheet 2 of 2 4,933,714

APPARATUS AND METHOD FOR REPRODUCING A PATTERN IN AN ANNULAR AREA

This application is a continuation of application Ser. No. 07/200,142, filed May 31, 1988 now abandoned.

FIELD OF THE INVENTION

This invention relates generally to photolithography, and more specifically to the application of restricted field optics in reproducing patterns in an annular area.

BACKGROUND OF THE INVENTION

Lithography, photolithography, and microlithography are techniques used to reproduce patterns. As the requirements of lithography have become more demanding the use of optics has increasingly been applied to lithography. This is especially true in semiconductor manufacturing where very small patterns or circuit geometries are reproduced. The use of optics in lithography to reproduce very small geometries is generally limited to the ability of the optical design to form an image without aberrations. Typically, the larger the image field the more difficult it is to correct for the optically introduced aberrations.

In most lithography applications the image field of the system must be as large as the object being reproduced. Therefore, for large objects having small geometries or patterns thereon the image field of the optical system must be large. However, due to the large image field and small geometries or patterns thereon it is difficult to correct for all of the aberrations introduced by the optical system to obtain a satisfactory image.

Several techniques have been developed in attempting to keep the image field size small, thereby reducing the number of aberrations resulting in better image quality. Two such techniques are step-and-repeat and scanning. In step-and-repeat systems a small image is reproduced multiple times on a larger field in a matrix or array type-fashion. The step-and-repeat technique is most appropriate when the pattern required is repetitive or consists of multiple duplicates of the same object. Scanning involves the use of a good-quality imaging field which typically is relatively large in one dimension and much smaller in an orthogonal direction (e.g., a rectangular or arcuate slit). The longer dimension must be at least equal to one dimension of the object to be reduced. The smaller image field dimension typically is much less than the corresponding dimension of the object to be reproduced. Full coverage of the object is obtained by scanning the field synchronously across the object and the image in a direction nominally parallel to the shorter dimension of the image field. This technique provides better image quality than would be possible with an optical system having an image field as large as the object to be reproduced. In most applications the scanning technique requires an image field at least as large in its longer dimension as the smallest overall dimension of the object being reproduced. For example, a rectangular object of finite width and infinite length can be reproduced if the larger dimension of the image field is as large as the width of the object.

Two patents that disclose optical systems that can be used in lithography and are particularly suited to the scanning technique are U.S. Pat. No. 3,821,763 issued June 28, 1974 to Scott entitled "Annular Field Optical Imaging System", and U.S. Pat. No. 3,748,015 issued July 24, 1973 to Offner entitled "Unit Power Imaging Catoptric Anastigmat", which are both incorporated herein by reference. These two patents disclose "ring-field" imaging systems that are advantageous for the reasons stated therein.

One application for these optical lithographic systems is in the volume production of optical disks, magnetic disks, and other disks having patterns thereon in an annular area. These patterns in an annular area may simply be comprised of concentric rings or concentric rings having information encoded thereon. As the information desired to be encoded on these disks becomes greater the number of concentric rings making up these disks necessarily becomes greater. This results in smaller images pushing the limits of current optical lithographical techniques in reproducing them. Existing reproduction techniques mandate that the image field be at least as large as the diameter of the disk being reproduced. Reproducing the ever decreasing geometries of the concentric rings on the disks over such a large image field has become increasingly difficult and costly Therefore, there is a tremendous need to more efficiently reproduce large quantities of disks that simply cannot be done with existing techniques.

SUMMARY OF THE INVENTION

The present invention is directed to efficiently reproducing master disks using optics, including ring-field optics. A restricted field optical system is positioned so that a chord of a section of the restricted field traverses a radial portion of the annular master. A portion of a disk-shaped substrate is positioned at the conjugate image location situated in the restricted field corresponding to the annular master. The substrate and the master are rotated about their respective central axes thereby exposing the substrate to the image field during rotation of the substrate. In practicing the present invention the image field need only be as large as the radial dimension of the image on the annular master to be imaged. Typically, this is substantially less than the radius of the annular master being reproduced. In the present invention the larger dimension of the imaging field need not equal the overall larger dimension of the annular master to be reproduced. The larger dimension of the image field can be equal to a portion of the radial width of the annular master, rather than equalling the outside diameter of the annular master.

Accordingly, it is an object of the present invention to economically reproduce disks having patterns thereon.

It is a further object of the present invention to use the annular nature of an object to best advantage.

It is an advantage of the present invention that less costly optics can be used.

It is yet a further advantage of the present invention that improved resolution is obtained.

It is a feature of the present invention that multiple reproductions can be made simultaneously.

It is a further feature of the present invention that only a portion of an annular master need be used to reproduce a disk having a pattern in an annular area thereon.

These and other objects, advantages, and features will become readily apparent in view of the following more detailed description.

DETAILED DESCRIPTION OF THE PREFERRED EMBODIMENTS

Figure 1:
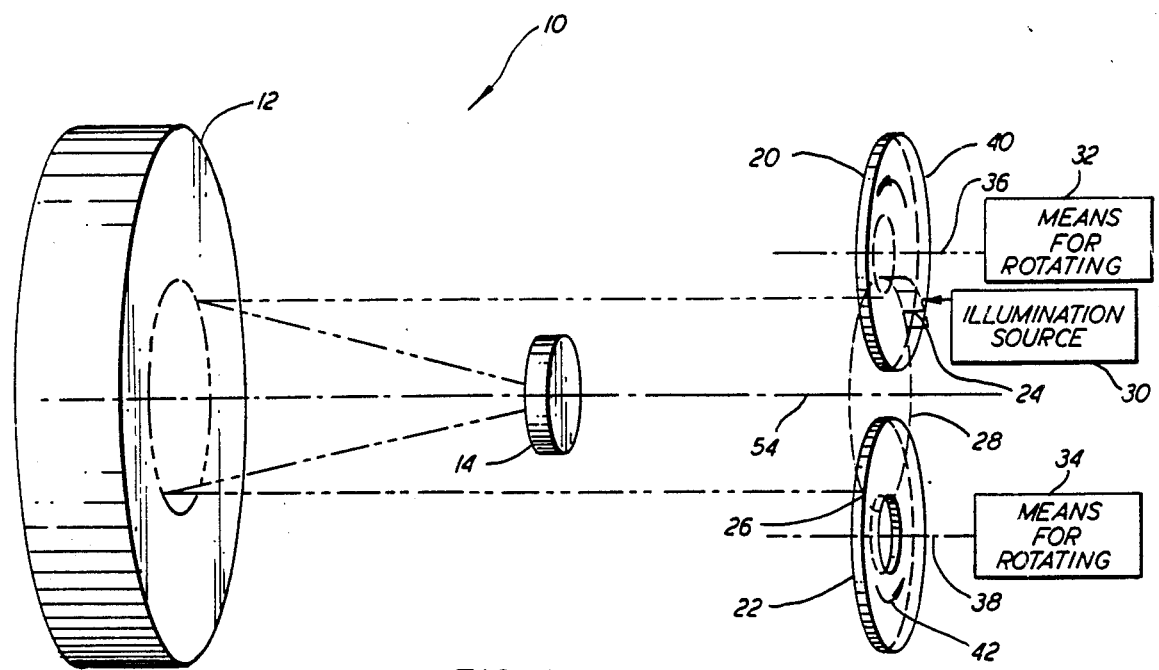
FIG. 1 is a pictorial representation of the present invention.

FIG. 1 illustrates a general form of the present invention. As is shown in FIG. 1 ring-field projection optical system 10 is comprised of a primary mirror 12 and a secondary mirror 14. While a ring-field projection optical system is shown, it should be understood that any projection optical system having acceptable imaging characteristics can be used in practicing the present invention. A master disk 20 having a pattern thereon is centered adjacent an object location 24 of the ring-field projection optical system 10. The object location 24 is a section of the ring-field 28 which has good imagery. This ring-field 28 having good imagery is inherent in ring-field optical systems. The chord of object location 24 extends along an approximately radial portion of master disk 20. The radial portion of master disk 20 at the object location 24 is imaged very precisely at image location 26. Image location 26 is the optical conjugate of object location 24. The portion of master disk 20 within the object location 24 is therefore imaged onto blank disk 22 at the image location 26.

Master disk 20 can have a pattern of alternating opaque and transparent sections such that illumination source 30 can be projected therethrough at the object location 24. Illumination souce 30 is configured to illuminate only object location 24. The primary function of the illumination source 30 is to deliver to the master disk 20, in the ring field 24 where good image quality pertains, the illumination required to expose the image of the master disk 20 onto the light sensitive blank disk 22. When the illumination source 30 is activated the master disk 20 is rotated in the direction of arrow 40 about a first axis 36 by means for rotating 32 to sequentially illuminate the radial portion of the entire master 20. Similarly, and in synchronization, blank disk 22 is rotated in the direction of arrow 42 about a second axis 38 by means for rotating 34 so that the radial portion on blank disk 22 is exposed at the image location 26 forming an exact replica of the pattern on the master disk 20. Master disk 20 and blank disk 22 are rotated in opposite directions, thereby cancelling angular momentum perturbations. In this way the entire master disk 20 can be replicated using an optical system having a maximum image field dimension of at most one half the diameter of the object being replicated.

Both the master disk 20 and the blank disk 22, together with the illumination source 30 can be comprised of any number of elements presently used in photolithographic techniques. For example, master 20 can be comprised of a mask or reticle, and blank 22 can have a photosensitive emulsion placed thereon which is exposed as just described and then later developed. The illumination source 30 can be accurately controlled to expose blank disk 22 for precisely one revolution, or to avoid the critical timing of the illumination source 30 blank disk 22 can be exposed in multiple revolutions rather than a single rotation. Also, rather than turning the illumination source off and on a shutter could be used to control exposure.

The general embodiment of this invention, as described above, is applicable regardless of the nature of the pattern in the annular region to be reproduced from the master to a blank substrate. In the special case where that pattern consists of circular lines and spaces concentric with each other and with the center of the annular imaging region, a further simplification is possible. Only a small portion of the master is required, this partial master can be fixed (non-rotating), and only the disk onto which the master is to be replicated need be rotated.

Figure 2:
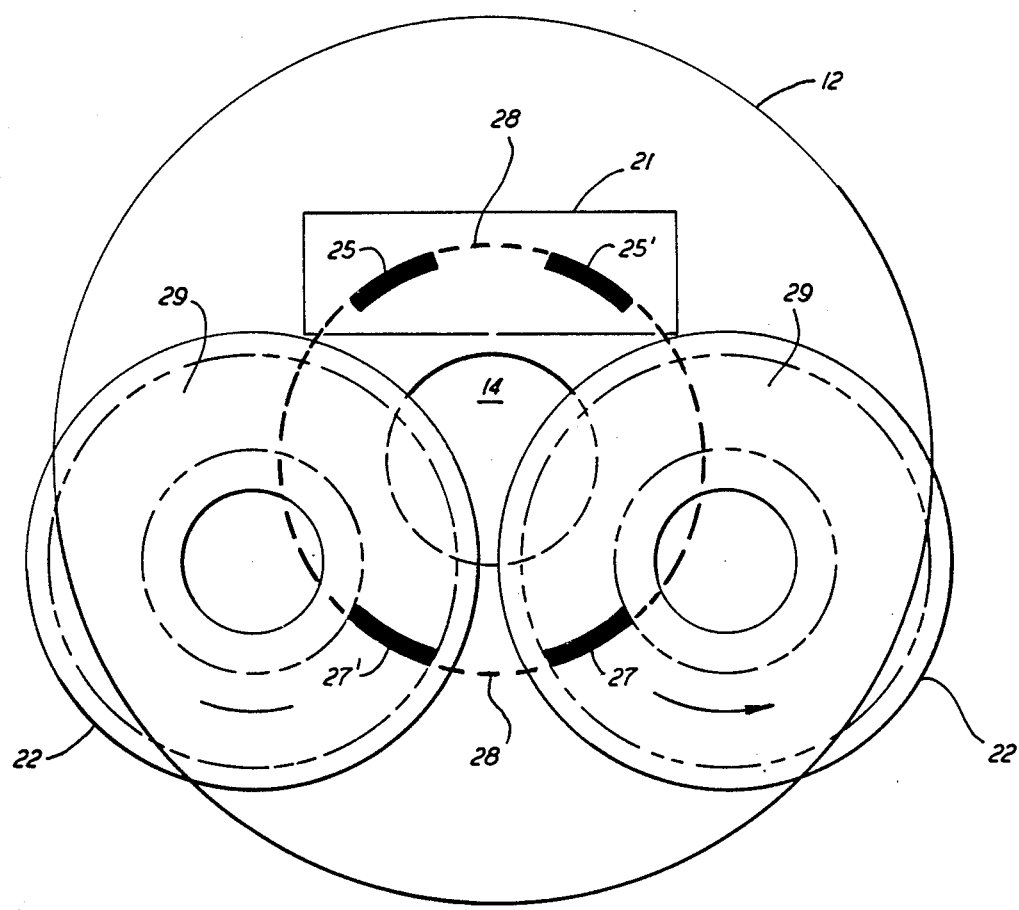
FIG. 2 is a plan view of another embodiment of the present invention.

FIG. 2 illustrates a possible embodiment of the invention applicable to this special case. Separate portions of a fixed dual partial master 21 are replicated respectively onto each of two blank disks 22.

As is shown in FIG. 2 primary mirror 12 and secondary mirror 14 comprise the ring-field projection optics used. The ring-field of good imagery is illustrated by dashed line 28. The dual partial master 21 is placed along a section of the ring-field 28. Blank disks 22 are positioned adjacent each other such that the radial portions 29 thereof are positioned so that a radial extent falls along the conjugate image portion of ring-field 28. A first object location 25 contains the pattern to be reproduced and is imaged by the ring-field projection optics at a first image location 27. Similarly, second object location 25' contains the pattern to be reproduced on blank disk 22 at a second image location 27'. When the dual partial master 21 is illuminated by a light source (not shown) images are formed at the corresponding first and second image locations 27 and 27'. As the blank disks 22 are rotated about central axes the patterns at the first and second object locations 25 and 25' are reproduced forming a pattern in an annular area on disks 22 within the radial portions 29. Multiple disks can therefore be simultaneously exposed increasing the efficiencies of producing large quantities of disks having a pattern in an annular area thereon. The number of disks that can be simultaneously exposed is limited only by their size and the number of radial portions of each blank disk that can be placed around the ring-field.

Figure 3:
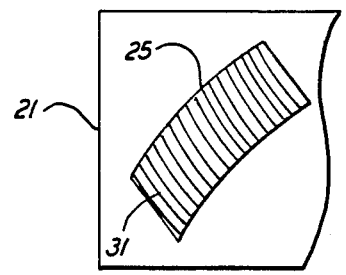
FIG. 3 shows an enlarged portion of FIG. 2.

FIG. 3 illustrates an enlarged portion of dual partial master 21. As can be seen in FIG. 3 first object location 25 is comprised of a portion of a pattern 31. It is this portion of a pattern 31 that is imaged onto the radial portion 29 on disk 22 at the first image location 27 in FIG. 2. Therefore, as blank disk 22 rotates a pattern is formed in an annular area thereon.

Generally, patterns are replicated from the master to the substrate via photographic or photoresist techniques for which there is an optimum level of exposure energy. This exposure energy is the product of illumination intensity and exposure time. Since this invention describes the exposure of substrate disks rotating about their centers, and since the tangential velocities of points in the annular imaging areas are therefore proportional to their radial positions, provision must be made to assure optimum (constant) exposure as a function of radius.

Figure 4:
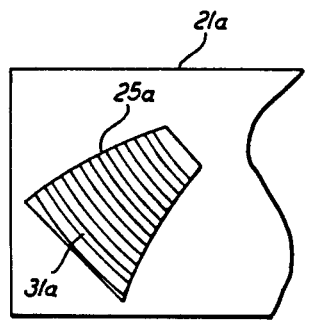
FIG. 4 shows a modified enlarged portion of FIG. 2.

One possibility is suggested by FIG. 4. The width of the illuminated area 25a is made proportional to the corresponding radial locations on disk 22 so that, as disk 22 rotates about its center, the transit time of any point on the disk acoss the image of illuminated area 25a is independent of radial position on the disk. With uniform illumination intensity, the required constancy of the (intensity × time) product is thereby assured.

Alternatively the constant-width illuminated areas 25 and 25' in FIG. 4 can be retained, and the illumination system can be made such that the intensity in the illuminated area varies in proportion to the corresponding radial positions on disks 22. This again achieves the required constancy of the (intensity × time) product.

Figure 5:
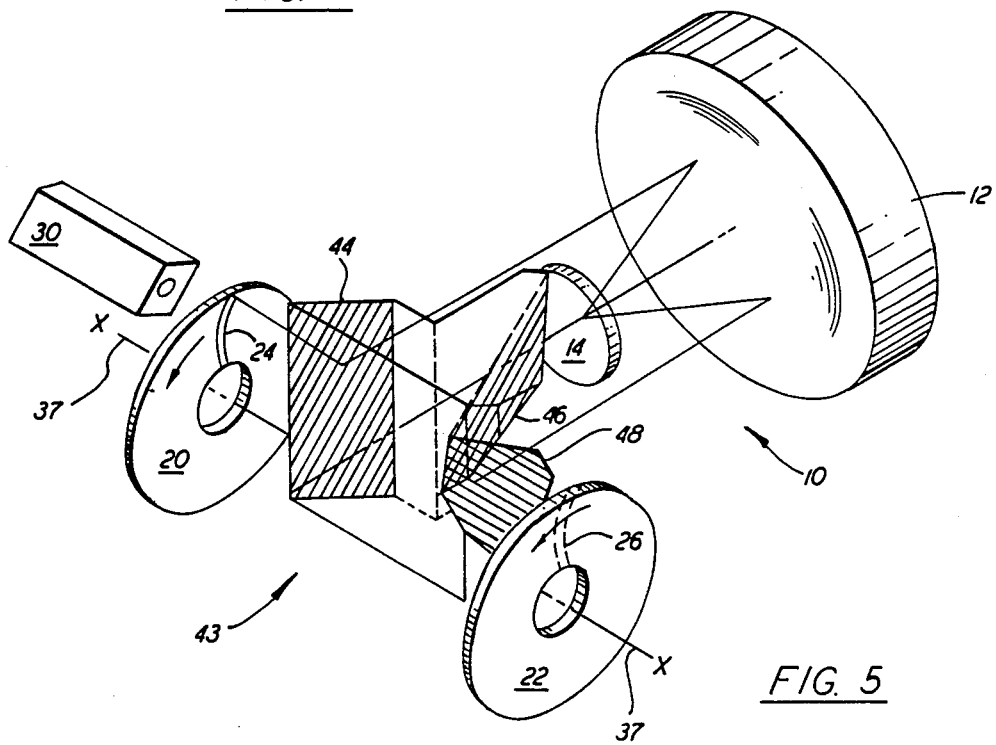
FIG. 5 is a pictorial representation of another embodiment of the present invention.

FIG. 5 illustrates another general-case embodiment of the present invention whereby the master disk 20 and the blank disk 22 can be physically connected and rotated on the same axis by a single rotation means. This eliminates synchronization problems that could arise when the master disk 20 and blank disk 22 are rotated on separate axes. Generally, the embodiment illustrated in FIG. 5 shows ring-field projection optics 10 cooperating with means for folding the light rays 43 from the object location 24 to project the image from master disk 20 onto blank disk 22 each rotating on a common axis 37. The means for folding the rays of light 43 from the image location comprises three mutually orthogonal plane mirrors 44, 46, and 48. Mirrors 46 and 48 form a 90-degree "roof mirror". Master disk 20 and blank disk 22 are thereby made parallel and concentric permitting the two disks to rotate on the same axis and in the same direction to map or replicate the master disk 20 onto the blank disk 22.

In another embodiment of the present invention spiral line-and-space patterns can be made. This can be accomplished by using a full master having the desired spiral pattern, or with a partial master. If the radial pitch of the desired spiral pattern is constant, a partial master could be used which advances radially by one pitch increment for each rotation of the blank disk.

Although several embodiments have been illustrated and described, it will be obvious to those skilled in the art that various modifications may be made without departing from the spirit and scope of this invention.

What is claimed is:

1. A device for reproducing patterns in an annular area comprising:
   a concave primary mirror;
   a convex secondary mirror of smaller radius of curvature than said primary mirror with its center of curvature substantially at the center of curvature of said primary mirror, said primary and secondary mirrors forming projection optics having an object and an image location, said image location forming an arcuate segment of a ring-field of good correction of said projection optics, said arcuate segment extending the entire radial length from the smaller inner diameter to the larger outer diameter of the annular area;
   a partial master, said master being stationary and positioned at the object location and containing thereon a portion of an annular pattern along the length thereof;
   an illumination source for projecting the image of said master; and
   rotating means for rotating an actinic annular blank through said image location such that said partial master exposes an annular pattern on said annular blank.

2. A device for reproducing annular patterns in an annular area comprising:
   a ring-field projection system having a ring-field;
   at least two stationary partial masters positioned within an object arcuate portion of said ring-field at at least two object locations, said at least two stationary masters each having a portion of an annular pattern thereon;
   at least two actinic annular blanks each having a radial portion thereon extending within an image arcuate portion of said ring-field at at least two image locations; and
   rotation means, associated with said at least two actinic annular blanks, for rotating said at least two actinic annular blanks;
   whereby an annular pattern is exposed on each of said at least two actinic annular blanks.

3. A device for reproducing annular patterns in an annular area as in claim 2 further comprising:
   means for providing a constant exposure on each of said actinic annular blanks at each of said at least two image locations.

4. A device as in claim 2 wherein:
   said means for providing a constant exposure comprises an opaque material having a varying width transparent slit therein positioned on each of said at least two stationary masters.

* * * * *